(12) United States Patent
Chang et al.

(10) Patent No.: US 11,282,982 B2
(45) Date of Patent: Mar. 22, 2022

(54) LIGHT-EMITTING DEVICE AND MANUFACTURING METHOD THEREOF

(71) Applicant: EPISTAR CORPORATION, Hsinchu (TW)

(72) Inventors: Li-Ming Chang, Hsinchu (TW);
Tzung-Shiun Yeh, Hsinchu (TW);
Chien-Fu Shen, Hsinchu (TW);
Wen-Hsiang Lin, Hsinchu (TW);
Pei-Chi Chiang, Hsinchu (TW);
Yi-Wen Ku, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/749,884

(22) Filed: Jan. 22, 2020

(65) Prior Publication Data

US 2020/0243714 A1 Jul. 30, 2020

(30) Foreign Application Priority Data

Jan. 25, 2019 (TW) ................... 108102983

(51) Int. Cl.
| | |
|---|---|
| *H01L 33/12* | (2010.01) |
| *H01L 33/10* | (2010.01) |
| *F21V 8/00* | (2006.01) |
| *H01L 33/00* | (2010.01) |
| *H01L 33/20* | (2010.01) |
| *H01L 33/60* | (2010.01) |

(52) U.S. Cl.
CPC ............ *H01L 33/10* (2013.01); *G02B 6/0073* (2013.01); *H01L 33/007* (2013.01); *H01L 33/0075* (2013.01); *H01L 33/20* (2013.01); *H01L 33/60* (2013.01)

(58) Field of Classification Search
None
See application file for complete search history.

(56) References Cited

U.S. PATENT DOCUMENTS

| | | | |
|---|---|---|---|
| 2013/0240932 A1* | 9/2013 | Tu ............................ | H01L 33/58 257/98 |
| 2014/0138613 A1* | 5/2014 | Kim ......................... | H01L 33/22 257/13 |
| 2014/0191243 A1* | 7/2014 | Singh ....................... | H01L 33/10 257/76 |
| 2017/0040491 A1* | 2/2017 | Chao ........................ | H01L 33/12 |

* cited by examiner

*Primary Examiner* — Ali Naraghi
(74) *Attorney, Agent, or Firm* — Patterson + Sheridan, LLP

(57) ABSTRACT

A light-emitting device, includes: a substrate, including a base with a main surface; and a plurality of protrusions on the main surface, wherein the protrusion and the base include different materials; and a semiconductor stack on the main surface, including a side wall, and wherein an included angle between the side wall and the main surface is an obtuse angle; wherein the main surface includes a peripheral area surrounding the semiconductor stack, and the peripheral area is devoid of the protrusion formed thereon.

17 Claims, 17 Drawing Sheets

| Light-emitting device | Optical output power (mW) | Divergence angle measured in X-axis (degree) | Divergence angle measured in Y-axis (degree) |
|---|---|---|---|
| Comparative example (Light-emitting device 6) | 44.29 | 132.45 | 138.4 |
| First embodiment (Light-emitting device 1) | 44.98 | 129.75 | 136.45 |

FIG. 7

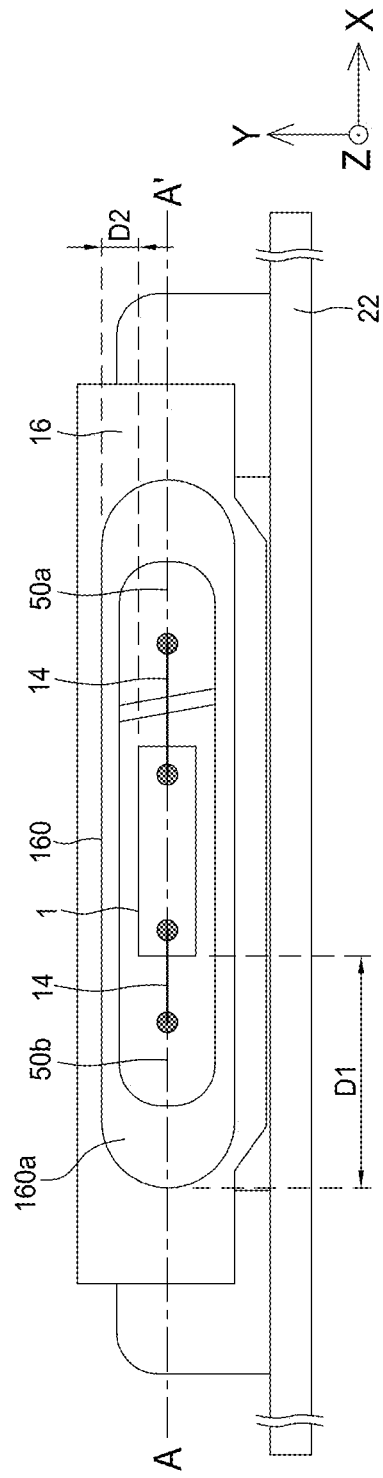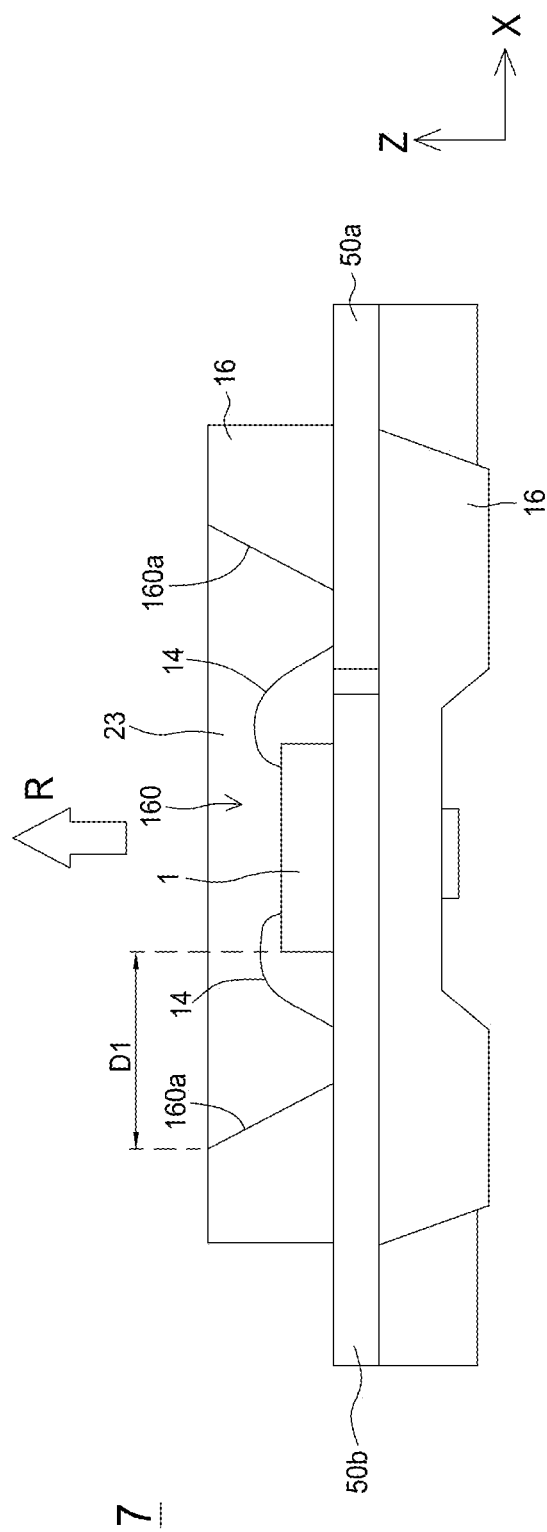
FIG. 10A
FIG. 10B

_US 11,282,982 B2_

LIGHT-EMITTING DEVICE AND MANUFACTURING METHOD THEREOF

CROSS-REFERENCE TO RELATED APPLICATIONS

This application claims priority to the benefit of Taiwan Patent Application Number 108102983 filed on Jan. 25, 2019, and the entire contents of which are hereby incorporated by reference herein in its entirety.

BACKGROUND

Technical Field

The present disclosure relates to a light-emitting device, more specifically, to a light-emitting device with an improved light-emitting efficiency.

Description of the Related Art

The light-emitting diodes (LEDs) of solid-state lighting device have the characteristics of low power consumption, low heat-generation, long lifetime, compact size, high response speed. Thus, the LEDs have been widely using in household appliance, lighting device, indicating lamp, optical device and the like. As the optical technique develops, solid-state lighting devices have great improvements in light-emitting efficiency, lifetime, and brightness.

A conventional LED chip includes a substrate, an n-type semiconductor layer, an active layer, a p-type semiconductor layer formed on the substrate, and p-electrode and n-electrode respectively formed on the p-type and n-type semiconductor layers. By applying a certain forward voltage on the LED chip via the electrodes, holes from the p-type semiconductor layer and electrons from the n-type semiconductor layer are combined in the active layer so as to emit light. However, the light generated by the LED may undergo totally internal reflection inside the semiconductor layers and the substrate. The light cannot be extracted from the LED effectively, thereby reducing light-extraction efficiency and brightness.

SUMMARY

A light-emitting device, includes: a substrate, including a base with a main surface; and a plurality of protrusions on the main surface, wherein the protrusion and the base include different materials; and a semiconductor stack on the main surface, including a side wall, and wherein an included angle between the side wall and the main surface is an obtuse angle; wherein the main surface includes a peripheral area surrounding the semiconductor stack, and the peripheral area is devoid of the protrusion formed thereon.

A light-emitting package, includes: a housing, including an opening; a lead frame covered by the housing; a light-emitting device, mounted in the opening and electrically connected to the lead frame, including: a substrate, including: a base with a main surface; and a plurality of protrusions on the main surface, wherein the protrusion and the base include different materials; a semiconductor stack on the main surface, including a side wall, and wherein an included angle between the side wall and the main surface is an obtuse angle; wherein the main surface includes a peripheral area not covered by the semiconductor stack, and the peripheral area is devoid of the protrusion formed thereon; and a filling material, filling in the opening and covering the light-emitting device.

BRIEF DESCRIPTION OF THE DRAWINGS

FIG. 7 shows an experimental result of the light-emitting device in accordance with one embodiment and the light-emitting device in accordance with the compared example.

FIG. 10A and FIG. 10B show a light-emitting package 7 in accordance with an embodiment of the present application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1A:
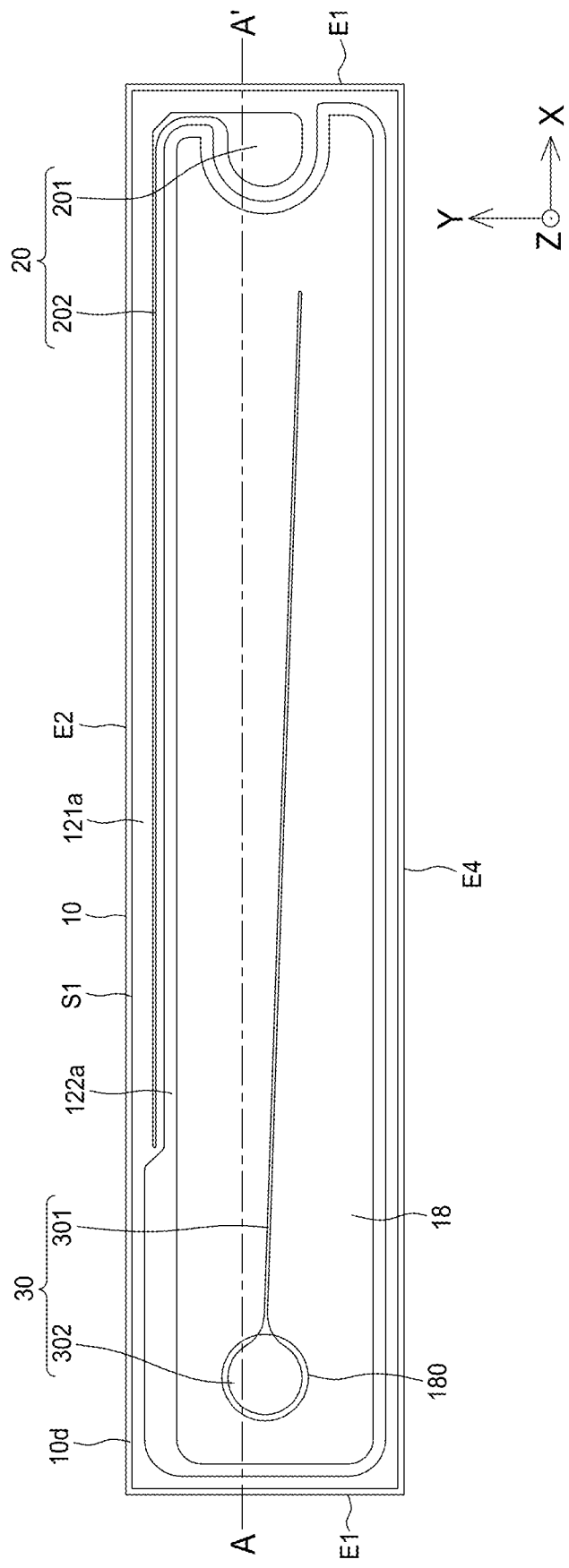
FIG. 1A and FIG. 1B show a top view and a cross-sectional view of a light-emitting device 1 in accordance with an embodiment of the present application.
Figure 1B:
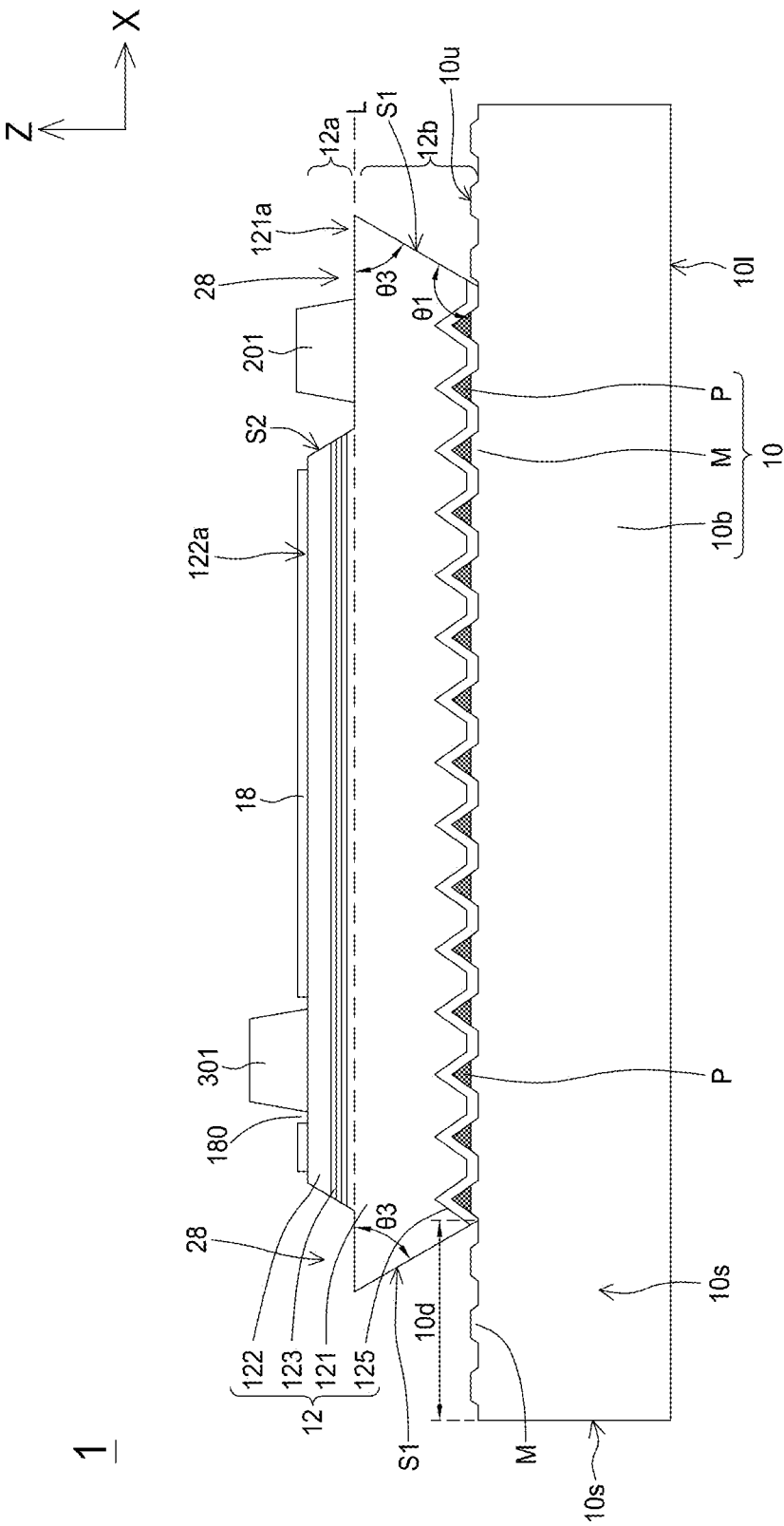

FIG. 1 shows a light-emitting device 1 in accordance with a first embodiment of the present application. FIG. 1B shows a cross-sectional view taken along the A-A' line in FIG. 1.

The light-emitting device 1 includes a substrate 10, a semiconductor stack 12 disposed on the substrate 10, a transparent conductive layer 18 disposed on the semiconductor stack 12, a first electrode 20, a second electrode 30, and a protective layer (not shown) covering the above layers and parts of the electrodes. The protective layer has openings exposing the other parts of the first electrode 20 and the second electrode 30. As shown in FIG. 1B, the substrate 10 includes a base 10b having a main surface 10u and a lower surface 101, a plurality of side walls 10s located between the main surface 10u and the lower surface 101, and a plurality of protrusions P separately disposed on the main surface 10u. In the present embodiment, the base 10b includes a plurality of mesas M on the side of the main surface 10u, and the protrusions P are correspondingly disposed on the mesas M. In one embodiment, the main surface 10u has a concave-convex surface, and wherein the convex surface forms the surface of the mesa M.

The base 10b can be a growth substrate for growing semiconductor layers thereon. The material of the base 10b includes GaAs or GaP that are used for growing AlGaInP semiconductor thereon. The material of the base 10b includes sapphire, GaN, SiC or AlN that are used for growing InGaN or AlGaN thereon.

The material of the protrusion P is selected from a material different from that of the base 10b. In one embodiment, the protrusion P includes transparent material, such as silicon dioxide ($SiO_2$), silicon nitride ($Si_xN_y$). In one embodiment, the refractive index of the protrusion P is smaller than the refractive index of the base 10b. The three-dimensional shape of the protrusion P can be a cone (such as a circular cone, a polygonal pyramid, or a truncated cone), a cylinder, or a hemisphere. The top of the mesa M is substantially flat, and the surface of the substrate 10 between the mesas M is substantially flat. In one embodiment, the surface of the substrate 10 between the mesas M is the c-plane of sapphire. In a top view, the shapes of the top and the bottom of the mesa M can be circular or polygonal. In the present embodiment, the top and bottom of the mesa M are both circular in a top view, and the protrusion P is circular cone.

In one embodiment, the light emitted from the semiconductor stack 12 irradiates on the main surface 10u of the base 10b and is refracted and reflected by the protrusion P and/or the mesa M. The ratio of the light that are directly extracted from the lower surface 101 and the side wall 10s of the substrate is reduced. More light can be extracted from the surface of the semiconductor stack, thereby reducing the divergence angle of the light-emitting device and increasing the brightness in a forward direction. In addition, the protrusion P and/or the mesa M lessens or suppress the dislocation due to lattice mismatch between the substrate 10 and the semiconductor stack 12, thereby improving the epitaxial quality of the semiconductor stack 12.

In an embodiment of the present application, the semiconductor stack 12 is formed on the substrate 10 by epitaxy such as metal-organic chemical vapor deposition (MOCVD), molecular beam epitaxy (MBE), hydride vapor epitaxy (HVPE) or physical vapor deposition such as sputtering or evaporating.

The semiconductor stack 12 includes a buffer layer 125, a first semiconductor layer 121, an active layer 123, and a second semiconductor layer 122 sequentially formed on the substrate 10. The buffer layer 125 is conformably formed on the protrusions P and the main surface 10u. The thickness of the buffer layer 125 is greater than 5 nm. In one embodiment, the thickness of the buffer layer 125 is not greater than 50 nm. In another embodiment, the thickness of the buffer layer 125 is between 10 nm and 30 nm (both included). The buffer layer 125 reduces the lattice mismatch and suppresses dislocation so as to improve the epitaxial quality. The material of the buffer layer 125 includes GaN, AlGaN, or AlN. In an embodiment, the buffer layer 125 includes two sub-layers (not shown) and wherein a first sub-layer thereof is grown by sputtering and a second sub-layer thereof is grown by MOCVD. In another embodiment, the buffer layer 125 further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In an embodiment, the first semiconductor layer 121 and the second semiconductor layer 122 are, for example, cladding layer or confinement layer. The first semiconductor layer 121 and the second semiconductor layer 122 have different conductivity types, different electrical properties, different polarities or different dopants for providing electrons or holes. For example, the first semiconductor layer 121 is an n-type semiconductor and the second semiconductor layer 122 is a p-type semiconductor. The active layer 123 is formed between the first semiconductor layer 121 and the second semiconductor layer 122. Driven by a current, electrons and holes are combined in the active layer 123 to convert electrical energy into optical energy for illumination. The wavelength of the light generated by the light-emitting device 1 or the semiconductor stack 12 can be adjusted by changing the physical properties and chemical composition of one or more layers in the semiconductor stack 12.

The material of the semiconductor stack 12 includes III-V semiconductor with $Al_xIn_yGa_{(1-x-y)}N$ or $Al_xIn_yGa_{(1-x-y)}P$, where $0 \leq x$, $y \leq 1$; $x+y \leq 1$. When the material of the active layer of the semiconductor stack 12 includes AlInGaP, it emits red light having a wavelength between 610 nm and 650 nm or yellow light having a wavelength between 550 nm and 570 nm. When the material of the active layer of the semiconductor stack 12 includes InGaN, it emits blue light or deep blue light having a wavelength between 400 nm and 490 nm or green light having a wavelength between 490 nm and 550 nm. When the material of the active layer of the semiconductor stack 12 includes AlGaN, it emits UV light having a wavelength between 250 nm and 400 nm. The active layer 123 can be a single hetero-structure (SH), a double hetero-structure (DH), a double-side double hetero-structure (DDH), or a multi-quantum well (MQW). The material of the active layer 123 can be i-type, p-type or n-type.

The semiconductor stack 12 includes a platform 28. The platform 28 is formed by removing portions of the second semiconductor layer 122 and the active layer 123 from the upper surface of the semiconductor stack 12 to expose the upper surface 121a of the first semiconductor layer 121. In a cross-sectional view, the portion of the semiconductor stack 12 above the extending line L (and the extending surface) of the platform 28 is defined as an upper semiconductor portion 12a, and the portion of the semiconductor stack 12 below the extending line L is defined as a lower semiconductor portion 12b. The upper semiconductor portion 12a includes the second semiconductor layer 122 and the active layer 123. In an embodiment, the upper semiconductor portion 12a further includes a portion of the first semiconductor layer 121. The lower semiconductor portion 12b includes the buffer layer and the other portion of the first semiconductor layer 121 or the entire first semiconductor layer 121.

The first electrode 20 is formed on the platform 28 and is electrically connected to the first semiconductor layer 121. The second electrode 30 is formed on the second semiconductor layer 122 and is electrically connected to the second semiconductor layer 122. In one embodiment, the first electrode 20 includes a first pad electrode 201 and a first finger electrode 202 extending from the first pad electrode 201. The second electrode 30 includes a second pad electrode 301 and a second finger electrode 302 extending from the second disk electrode 301. The first pad electrode 201 and the second pad electrode 301 are used for wire bonding or soldering, so that the light-emitting device 1 is electrically connected to an external power source or an external electronic component. In the embodiment shown in FIG. 1, the substrate 10 includes a pair of short edges E1 and E3 and a pair of long edges E2 and E4. The first pad electrode 201 and the second pad electrode 301 are respectively disposed adjacent to the two short edges E1 and E3, and the first finger electrode 202 and the second finger electrode 302 extend to the opposite edges E3 and E1, respectively. In another embodiment, the first electrode 20 does not have the first finger electrode 201. In the present application, the configurations of the first electrode 20 and the second electrode 30 is not limited to that shown in this embodiment. In one embodiment, the second finger electrode 302 is disposed parallel to the first finger electrode 202. In another embodiment, the first pad electrode 201 and/or the second pad electrode 301 are respectively disposed near two diagonal corners of the light-emitting device 1.

The transparent conductive layer 18 is formed under the second electrode 30, covers the upper surface 122a of the second semiconductor layer 122, and electrically contacts the second semiconductor layer 122 for laterally spreading current. The transparent conductive layer 18 can be metal or transparent conductive material. The metal can be a thin metal layer having light transparency. The transparent conductive material is transparent to the light emitted by the active layer 123, such as zinc aluminum oxide (AZO), gallium zinc oxide (GZO), or indium zinc oxide (IZO). In one embodiment, the transparent conductive layer 18 has an opening 180 corresponding to the position of the second pad electrode 301, so that the second pad electrode 301 contacts the second semiconductor layer 122 through the opening 180.

In one embodiment, the light-emitting device 1 further includes a current blocking layer (not shown) between the transparent conductive layer 18 and the second semiconductor layer 122, and/or between the first electrode 20 and the first semiconductor layer 121.

As shown in FIG. 1B, the lower semiconductor portion 12b includes a first side wall S1, and the upper semiconductor portion 12a includes a second side wall S2. An included angle θ1 between the first side wall S1 and the main surface 10u of the base 10b is an obtuse angle, and an included angle θ3 between the first side wall S1 and the upper surface 121a of the first semiconductor layer is an acute angle. In one embodiment, θ1 is between 100 degrees and 160 degrees, and θ3 is between 20 degrees and 80 degrees. θ1 and θ3 are supplementary. In another embodiment, the first side wall S1 has a rough surface, which can further improve light extraction of the light-emitting device 1.

Figure 1C:
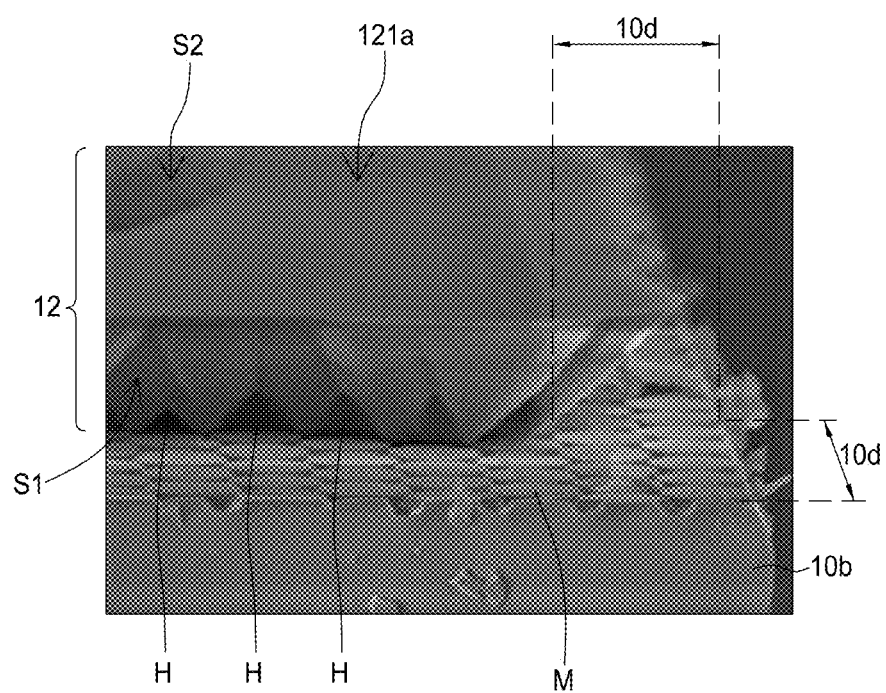
FIG. 1C shows a scanning electron microscope image (SEM) of a peripheral area and a semiconductor stack adjacent to the peripheral area of the light-emitting device 1 in accordance with another embodiment of the present application.
Figure 5A:
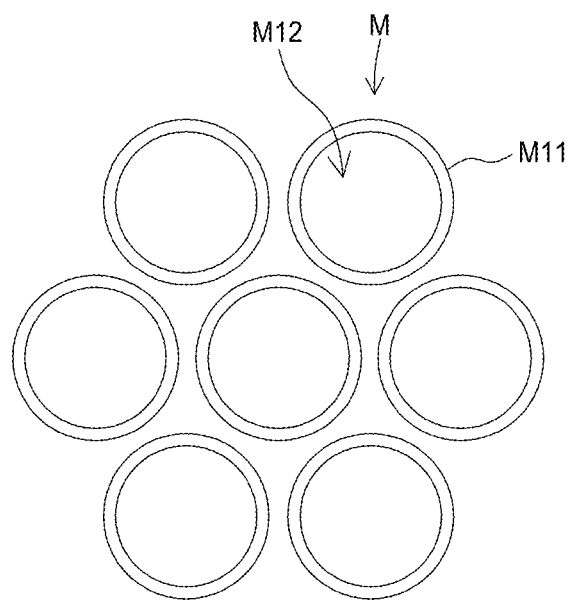
FIG. 5A and FIG. 5B show mesas of different embodiments of the light-emitting device 1.
Figure 5B:
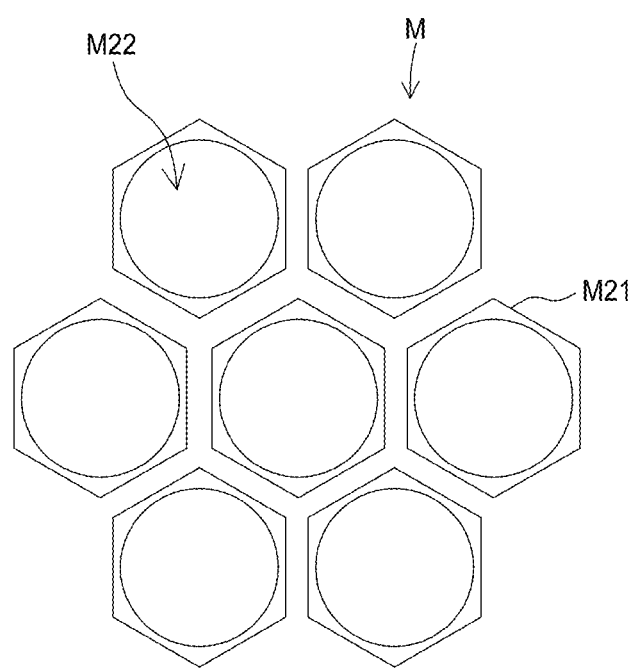

The main surface 10u includes a peripheral area 10d that is located on the periphery of the substrate 10 and is not covered by the semiconductor stack 12. In a top view, the peripheral area 10d surrounds the semiconductor stack 12. FIG. 1C shows a scanning electron microscope image (SEM) of the peripheral area 10d and the semiconductor stack 12 adjacent to the peripheral area 10d of the light-emitting device 1. As shown in FIG. 1B and FIG. 1C, there are only mesas M in the peripheral area 10d. No protrusions P are on the peripheral area 10d. In one embodiment, the height of the mesa M in peripheral area 10d is greater than the height of the mesa M under the semiconductor stack 12 (not shown). In one embodiment, the mesa M in the peripheral area 10d and the mesa M under the semiconductor stack 12 have the same shape. In another embodiment, the mesa M in the peripheral area 10d and the mesa M under the semiconductor stack 12 have different shapes. FIG. 5A shows a top schematic view of the mesa M under the semiconductor stack 12 and FIG. 5B shows a top schematic view of the mesa M in the peripheral area 10d. As shown in FIG. 5A, both the top M12 and the bottom M11 of the mesa M under the semiconductor stack 12 are circular. As shown in FIG. 5B, the top M22 of the mesa M in the peripheral area 10d is circular, and the bottom M21 is polygonal. In an embodiment, as shown in FIG. 1C, there is a plurality of holes H between the first side wall S1 and the main surface 10u. The positions of the holes H correspond to the mesas M, and there are no protrusions P in the holes H.

Figure 2A:
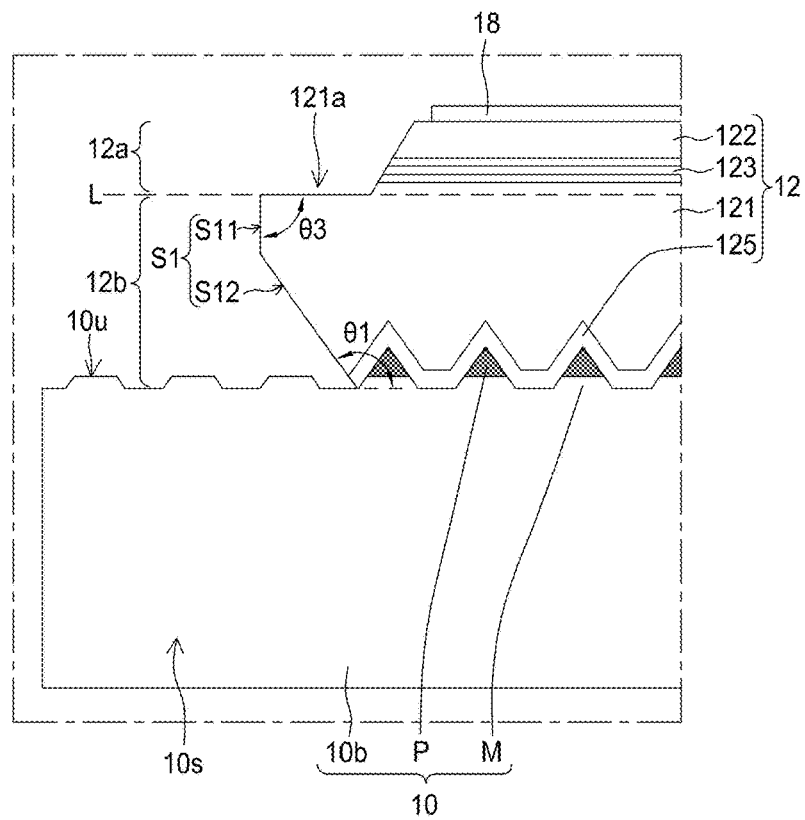
FIG. 2A and FIG. 2B show partial cross-sectional views of a light-emitting device 2 in accordance with another embodiment of the present application.
Figure 2B:
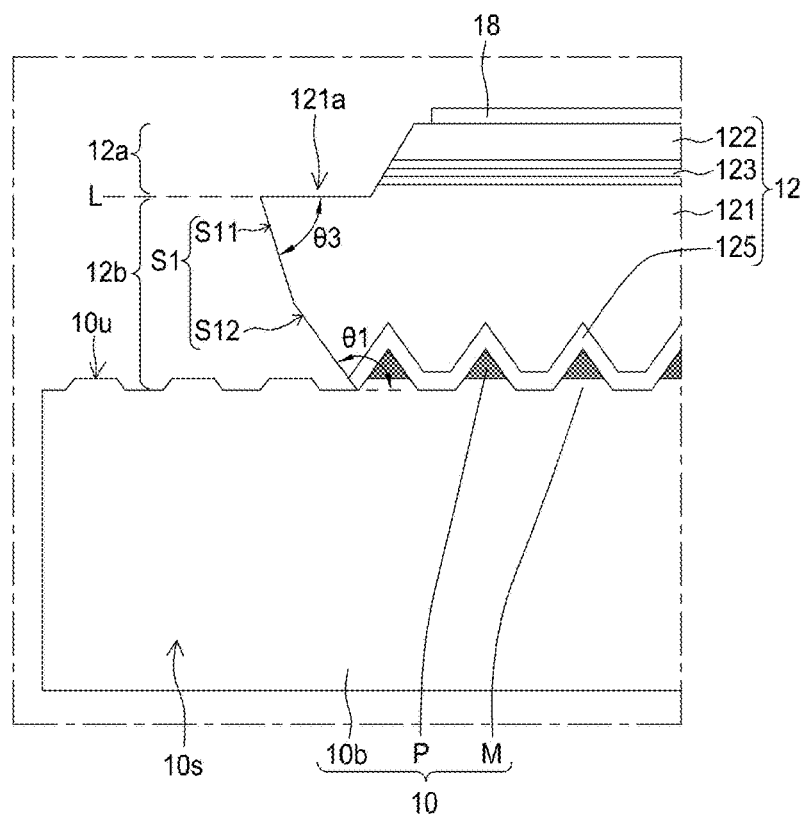

FIGS. 2A and 2B are partial cross-sectional views of a light-emitting device 2 in accordance with a second embodiment of the present application. The structure of the light-emitting device 2 is similar to that of the light-emitting device 1. The difference is that the first side wall S1 of the lower semiconductor portion 12b in the light-emitting device 2 includes a plurality of sub-side walls, such as the first sub-side wall S11 and the second sub-side wall S12. As shown in FIG. 2A and FIG. 2B, the first sub-side wall S11 is connected to the second sub-side wall S12, and the included angle (not labeled) between the first sub-side wall S11 and the second sub-side wall S12 is 100-175 degrees. The included angle θ1 between the second sub-side wall S12 and the main surface 10u of the base 10b is an obtuse angle. As shown in FIG. 2A, the included angle θ3 between the first sub-side wall S11 and the upper surface 121a of the first semiconductor layer 121 is 80-100 degrees. In one embodiment, the included angle θ3 is substantially a right angle. As shown in another embodiment of FIG. 2B, the included angle θ3 is an acute angle.

Figure 3:
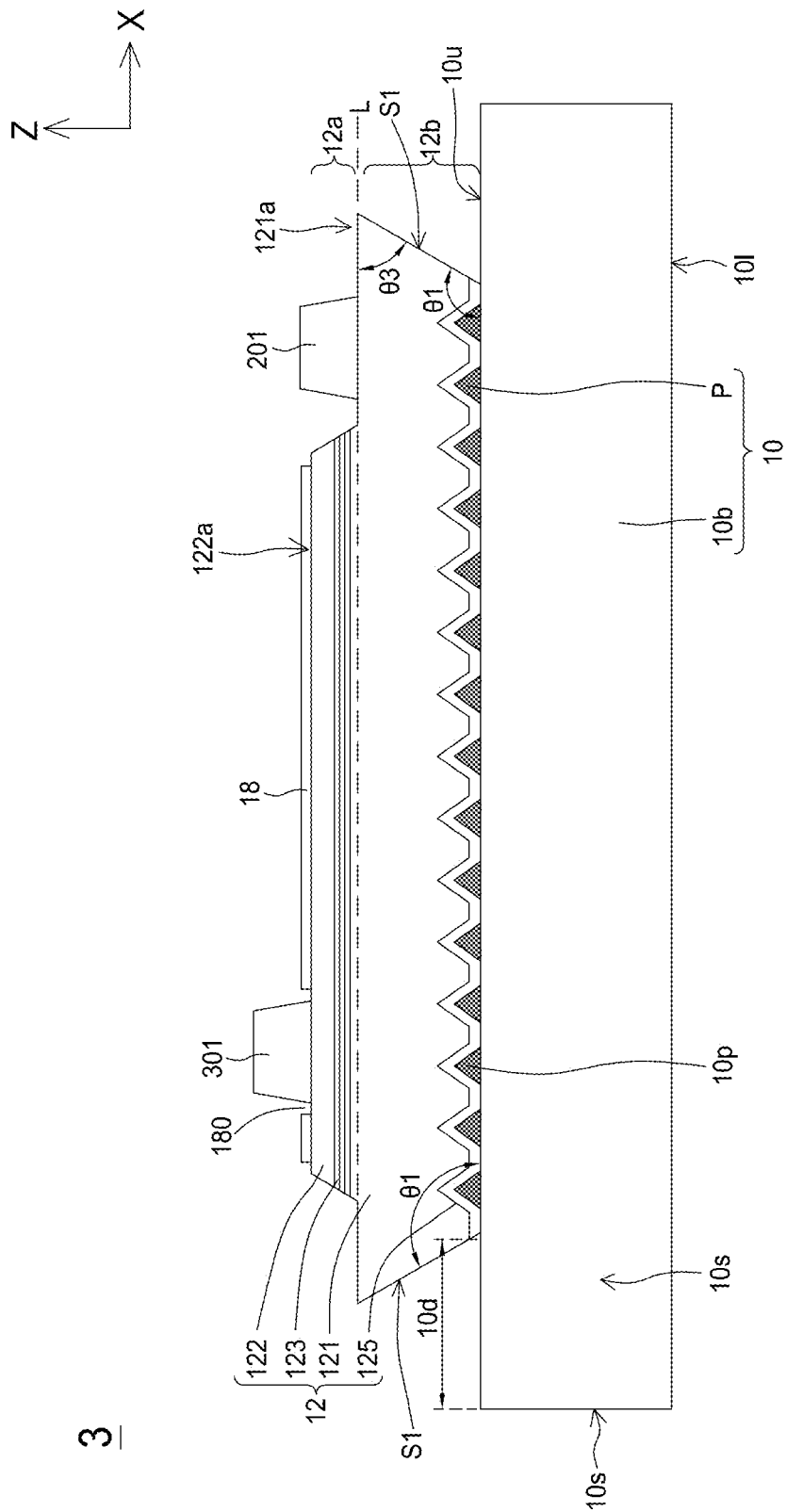
FIG. 3 shows a cross-sectional view of a light-emitting device 3 in accordance with another embodiment.

FIG. 3 is a cross-sectional view of a light-emitting device 3 in accordance with a third embodiment of the present application. The structure of the light-emitting device 3 is similar to that of the light-emitting device 1, and the main difference is that the main surface 10u of the base 10b in the light-emitting device 3 is a plane without mesas M located thereon. The plurality of protrusions P is separately disposed on the main surface 10u. The peripheral area 10d of the light-emitting device 3 is a flat plane which is devoid of the protrusions P formed thereon.

Figure 4:
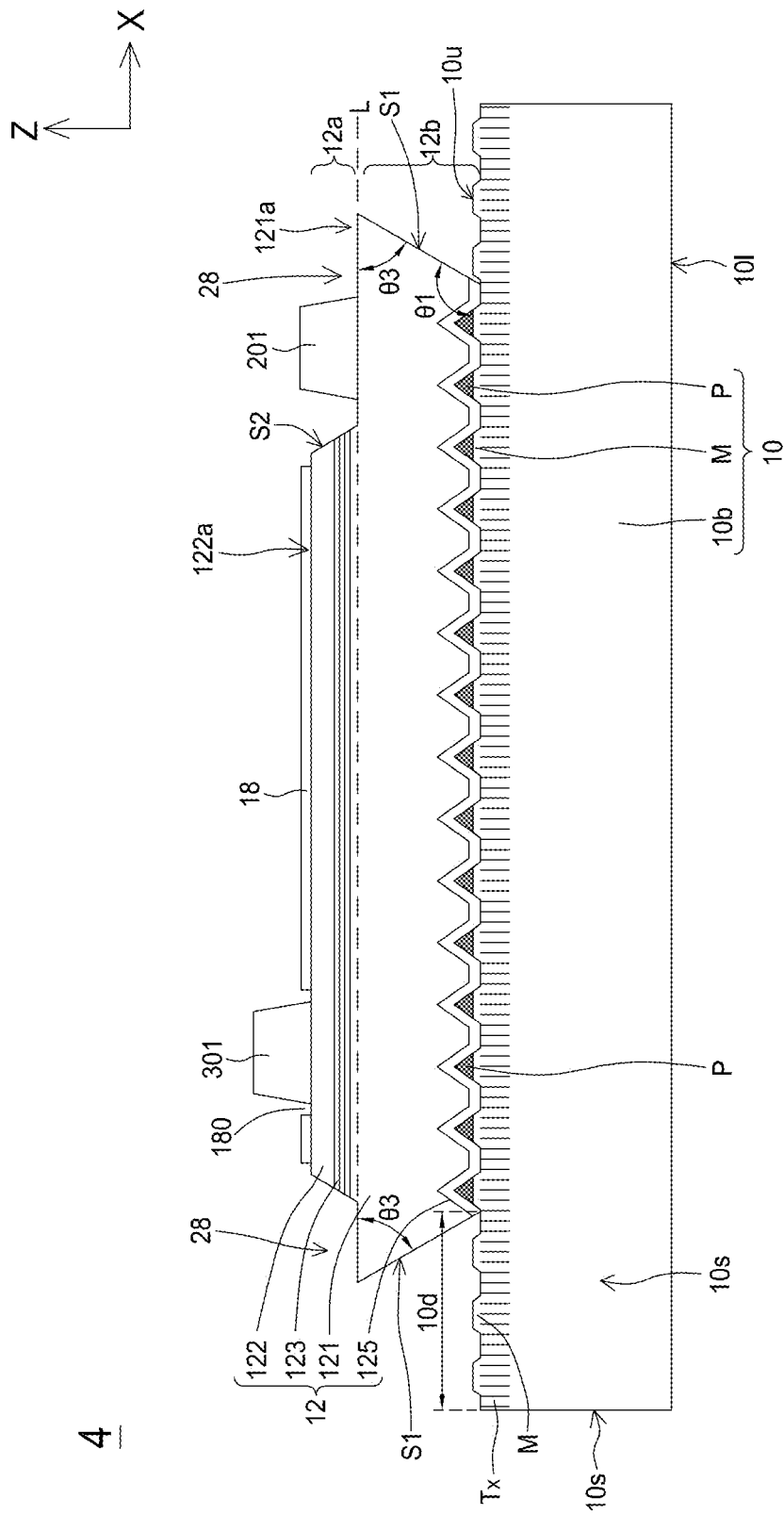
FIG. 4 shows a cross-sectional view of a light-emitting device 4 in accordance with another embodiment.

FIG. 4 is a cross-sectional view of a light-emitting device 4 in accordance with a fourth embodiment of the present application. The structure of the light-emitting device 4 is similar to that of the light-emitting device 1, and the main difference is that the side wall 10s of the base 10b in the light-emitting device 4 has a rough region Tx. The rough region Tx is adjacent to the main surface 10u and connected to the main surface 10u. The surface roughness of the rough region Tx is greater than that of the region other than the rough region Tx on the side wall 10s.

A light-emitting device (not shown) in another embodiment of the present application has a structure similar to that of the light-emitting device 1, and the main difference is that the peripheral area 10d is devoid of protrusion P and mesas M thereon.

It will be apparent to those having ordinary skill in the art that various modifications and variations can be made to the light-emitting devices in accordance with the present embodiments without departing from the scope or spirit of the application. For example, the side wall 10s of the light-emitting device 3 in the third embodiment may include the rough region Tx as described in the fourth embodiment. For example, the first side walls S1 of the light-emitting device 3 in the third embodiment and of the light-emitting device 4 in the fourth embodiment may include the plurality of sub-walls as described in the second embodiment.

Figure 6:
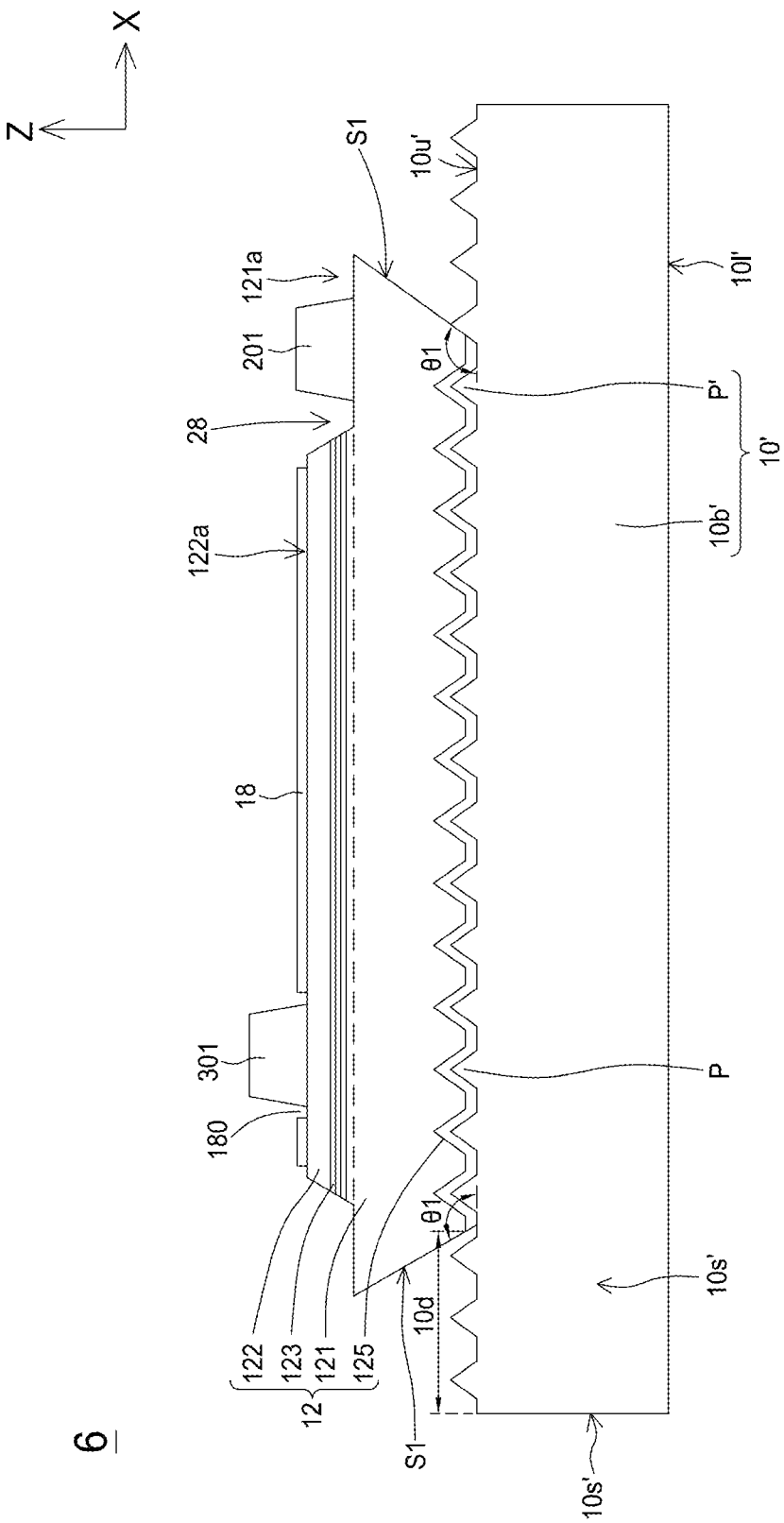
FIG. 6 shows a cross-sectional view of a light-emitting device 6 in accordance with a comparative example.
Figure 8A:
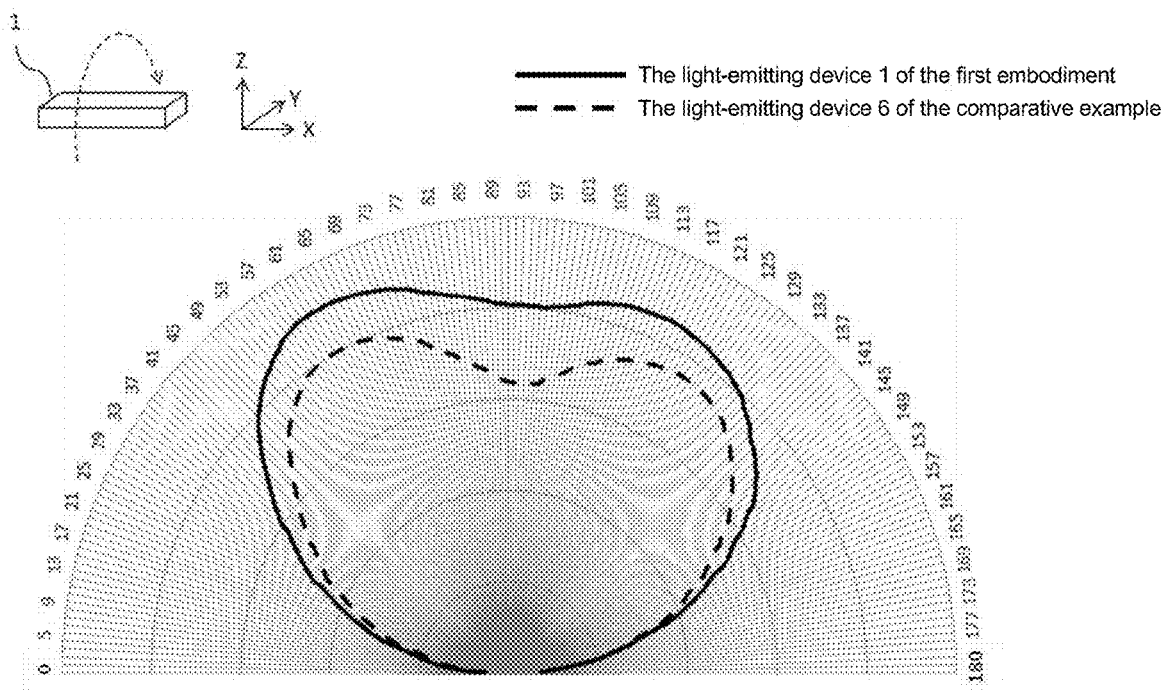
FIG. 8A and FIG. 8B show light distribution curves of the light-emitting device in accordance with one embodiment and the light-emitting device in accordance with the compared example.
Figure 8B:
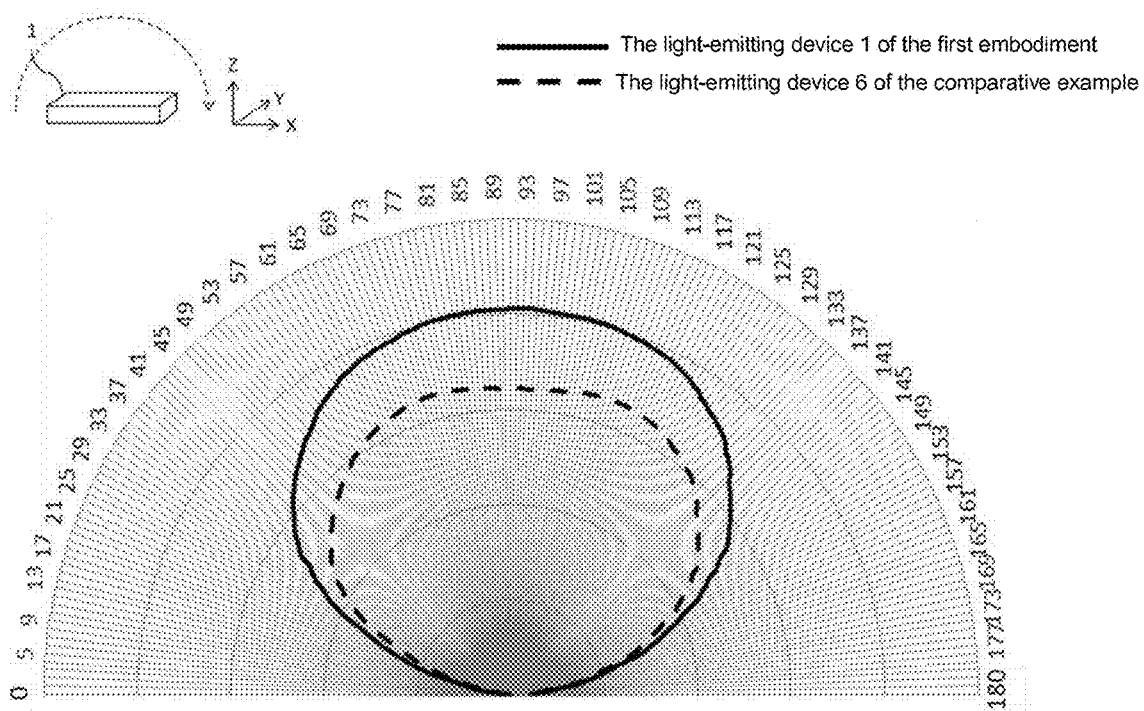

FIG. 6 shows a light-emitting device 6 in accordance with a comparative example. FIG. 7 shows an experimental comparison between the light-emitting device 1 of the first embodiment and the light-emitting device 6 of the comparative example. Referring to FIG. 6, the light-emitting device 6 of the comparative example has a similar structure to that of the light-emitting device 1, and the main difference is that the base 10b' of the light-emitting device 6 is devoid of mesas M thereon, the protrusion P' of the substrate 10' has the same material as the base 10b', and the protrusion P' are on the peripheral area 10d of the light-emitting device 6. The total size (i.e. the total height and the total width) of one mesa M and one protrusion P above it in the light-emitting device 1 is the same as the size of one protrusion P' in the light-emitting device 6, and the shapes and distributions are the same. The base 10b of the light-emitting device 1 and the base 10b' of the light-emitting device 6 are made of the same material. As shown in FIG. 7, compared with the light-emitting device 6 of the comparative example, the light-emitting device 1 in accordance with the first embodiment has 1.56% improvement in optical output power and a smaller divergence angle. Furthermore, compared with the light-emitting device 6 of the comparative example, the light emitted by the light-emitting device 1 in the first embodiment in the forward direction (the normal direction of the main surface 10u of the base 10b, that is, Z-axial direction in FIGS. 1A and 1B) is more concentrated and the light-emitting device 1 has higher brightness in the forward direction. FIGS. 8A and 8B show the light distribution curves of the light-emitting device 1 of the first embodiment and the light-emitting device 6 of the comparative example along different axels. To be more specific, FIG. 8A shows the light distribution curves of the two light-emitting devices 1 and 6 measured in the Y-axis direction from 0 to 180 degrees; FIG. 8B shows the light distribution curves of the two light-emitting devices 1 and 6 in the X-axis direction from 0 to 180 degrees. The 90 degrees labeled in the coordinates in the two figures is the positive Z-axis direction in FIG. 1A. As shown in FIGS. 8A and 8B, compared with the comparative example, the light-emitting device 1 has a higher light intensity near 90 degrees, which means that the light-emitting device 1 has a higher light intensity in the forward direction. In one embodiment, the divergence angle of the light-emitting device 1 measured along one axial direction is less than or equal to 130 degrees.

Figure 9A:
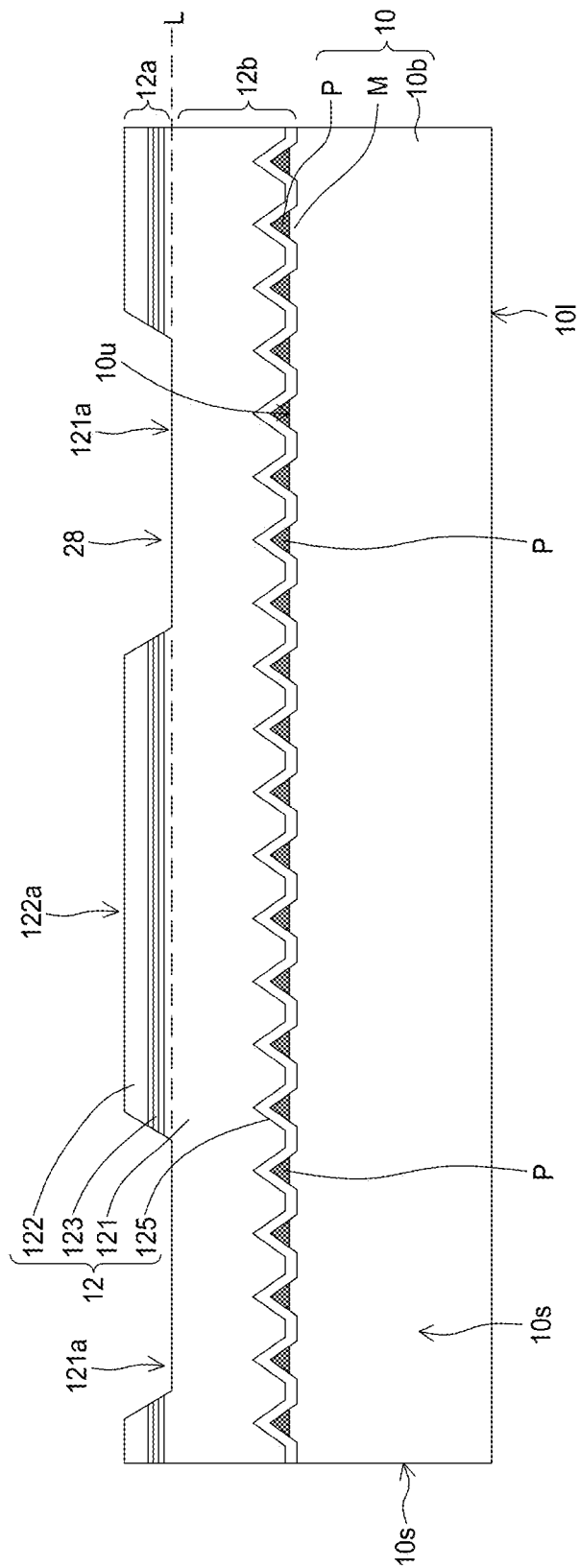
FIGS. 9A to 9E show a manufacturing method of the light-emitting device 1 in accordance with an embodiment of the present application.

FIGS. 9A-9E show a manufacturing method of the light emitting device 1 in accordance with an embodiment of the present application. First, as shown in FIG. 9A, the semiconductor stack 12 is formed on the substrate 10 to form a wafer. The substrate 10 includes the base 10b, the mesas M, and the protrusions P and the semiconductor stack 12 covers the protrusions P and the main surface 10u. Next, a part of the semiconductor stack 12 is removed to expose the upper surface 121a of the first semiconductor layer 121, and the platform 28 is formed. In a cross-sectional view, the portion of the semiconductor stack 12 above the extension line L (and the extension surface) of the platform region 28 is defined as the upper semiconductor portion 12a, and the other portion of the semiconductor stack 12 under the extension line L (and the extension surface) of the platform region 28 is defined as the lower semiconductor portion 12b.

Figure 9B:
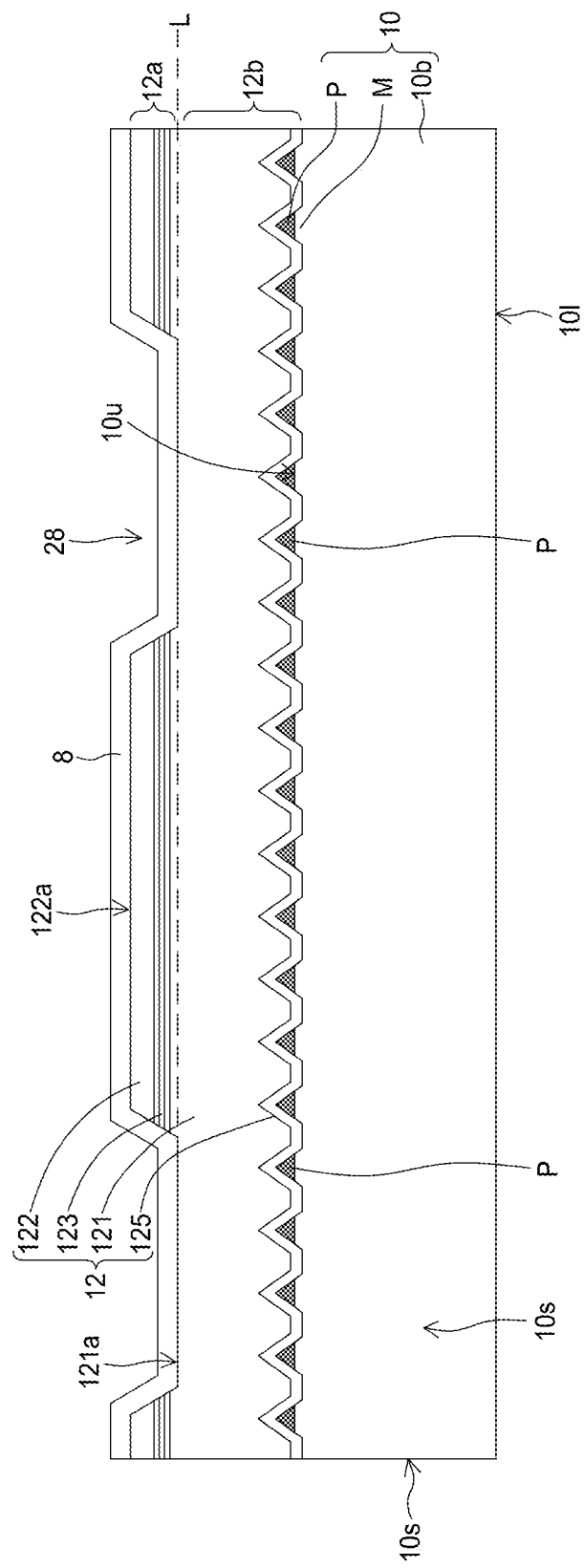

Next, as shown in FIG. 9B, a protective layer 8 is formed on the semiconductor stack 12 and the platform 28. In one embodiment, the thickness of the protective layer 8 is 500 Å-5000 Å, and the material of the protective layer 8 can be selected from silicon oxide, silicon nitride, or a combination thereof. The protective layer 8 can be formed by a chemical vapor deposition (CVD), atomic layer deposition (ALD), or spin-coating.

Figure 9C:
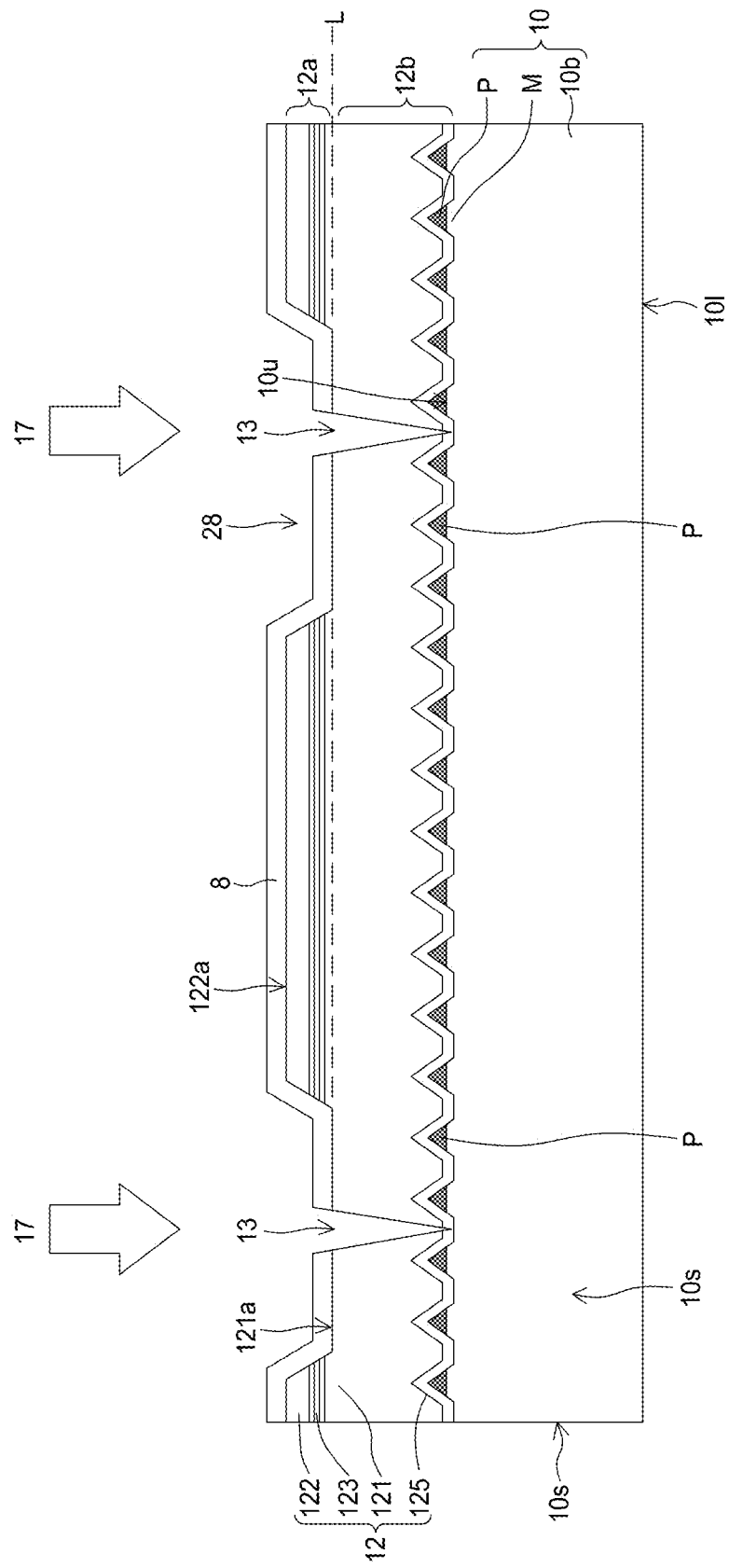

Next, as shown in FIG. 9C, scribing lines 13 is formed. In one embodiment, as shown in FIG. 9C, a laser 17 is irradiated from the upper surface of the protective layer 8. The laser 17 cuts the semiconductor stack 12 from the upper surface of the protective layer 8 down to a depth of the lower semiconductor portion 12b; for example, to a surface of the buffer layer 125 or to a depth into the buffer layer 125, to form the scribing lines 13. In another embodiments, the laser 17 cuts the semiconductor stack 12 from the upper surface of the protective layer 8 down to a depth into the protrusion P, to a depth into the mesa M, or to the main surface 10u of the substrate, to form the scribing lines 13. At the same time, the scribing line 13 defines a plurality of light-emitting devices 1 on the wafer. That is, the scribing lines 13 define the periphery of each light-emitting device 1. In another embodiment, the laser 17 cuts the semiconductor stack 12 from the upper surface of the protective layer 8 down to a depth into the base 10b to form a rough region (not shown) inside the base 10b. After individual light-emitting device 1 is formed, the rough region Tx as shown in FIG. 4 is correspondingly formed on the side wall 10s of the base 10b.

In another embodiment, the scribing line 13 is formed by etching (not shown). A dry etching such as inductively coupled plasma (ICP) etching is performed on the upper surface of the protective layer 8 to etch the lower semiconductor portion 12b down to a depth of the lower semiconductor portion 12b, to a depth into the protrusion P, or to a depth to the main surface 10u of the substrate, to form the scribing line 13.

Figure 9D:
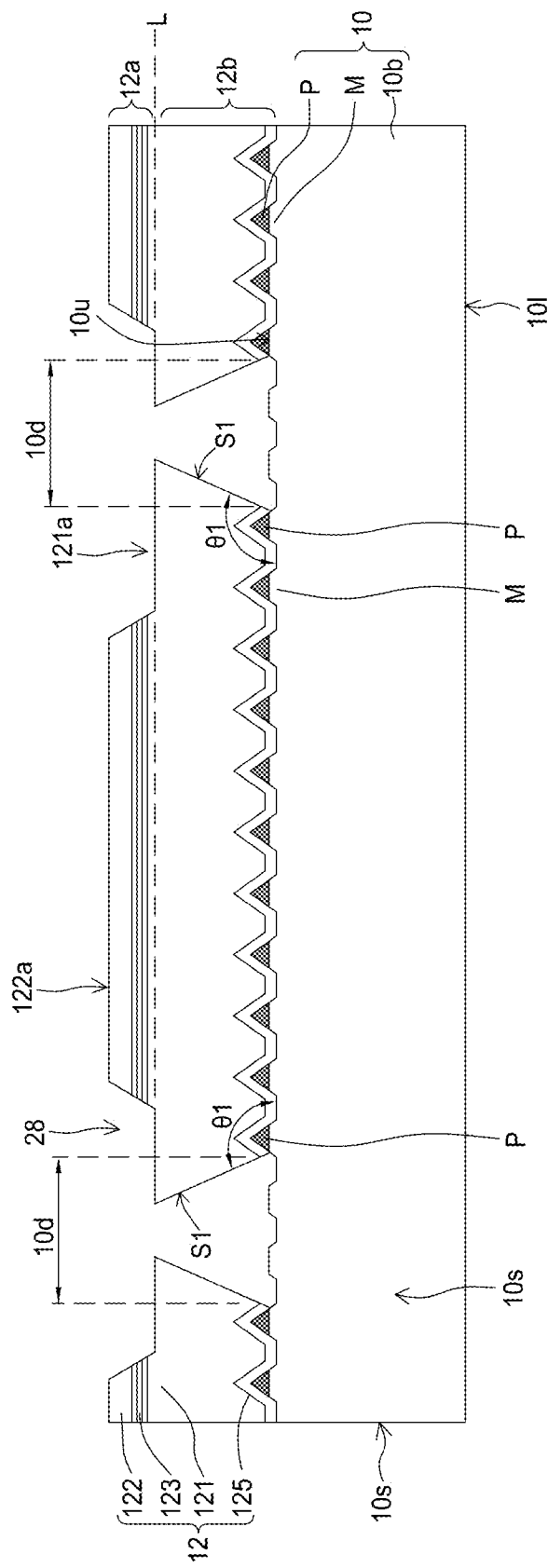

Next, as shown in FIG. 9D, parts of the lower semiconductor stack 12b, parts of the protrusions P and the protective layer 8 are removed. The steps of removing the parts of the lower semiconductor stack 12b, the parts of the protrusions P, and the protective layer 8 can be completed in the same step or in different steps. The steps of removing the parts of the lower semiconductor stack 12b, the parts of the protrusions P, and the protective layer 8 can be performed by the same method or by different methods. In one embodiment, removing the parts of the lower semiconductor stack 12b is by an etching step. In one embodiment, wet etching is applied to remove the parts of the lower semiconductor portion 12b in the gaps formed by the scribing lines 13 to form the first side wall S1. After the first sidewall S1 of each light-emitting device 1 is formed, the substrate 10 exposed between adjacent light-emitting devices 1 forms the peripheral area 10d. In one embodiment, after the first sidewall S1 of each light-emitting device 1 is formed, a portion of the upper surface of the lower semiconductor portion 12b that is not removed between adjacent light-emitting devices 1 forms the peripheral area 10d. In one embodiment, the etchant can be selected from $H_2SO_4$, $H_3PO_4$, HCl, HF or a combination thereof. In another embodiment, after the first sidewall S1 is formed, a roughening step can be performed on the first sidewall S1. For example, the first side wall S1 is etched by KOH to form a rough structure (not shown) thereon. The angle between the first side wall S1 and the main surface 10u can be controlled by the composition of the etchant, the etching time, and the etching temperature. In addition, by adjusting the depth of the scribing line 13 and different etching conditions, a plurality of sub-side walls as shown in FIGS. 2A and 2B can be formed. In one embodiment, the protective layer 8 can be removed in the etching process that removes the portion of the lower semiconductor portion 12b. In one embodiment, the protrusions P on the peripheral area 10d can be removed in the etching process that removes the portion of the lower semiconductor portion 12b.

In another embodiment, removing the protective layer 8 and removing the portion of the lower semiconductor portion 12b are performed in different steps. In one embodiment, the protective layer 8 is removed by a first etchant, and the portion of the lower semiconductor portion 12b is removed to form the first sidewall S1 by a second etchant. The composition of the first etchant is different from the composition of a second etchant. In one embodiment, removing the protrusions P on the peripheral area 10d and removing the portion of the semiconductor stack 12 are performed in different steps. In one embodiment, removing the protrusions P on the peripheral area 10d and removing the protective layer 8 are performed in different steps. In another embodiment, removing the protrusions P on the peripheral area 10d and removing the protective layer 8 are performed in the same step. That is, during the step while removing the protective layer 8, the protrusions P on the peripheral area 10d are also removed. As shown in FIG. 9D, the mesas M are located on the peripheral area 10d between adjacent light-emitting devices, but the peripheral area 10d is devoid of the protrusions P formed thereon.

In another embodiment, the step of removing the protrusion P on the peripheral area 10d may be affected by factors such as the etchant and/or etching conditions thereof, so that the protrusions P on the peripheral area 10d are not completely removed and left on the peripheral area 10d. The protrusions P left on the peripheral area 10d have smaller width, smaller height, a deformed appearance or a reduced size compared with the protrusions P under the semiconductor stack 12. For example, the protrusions P on one part of the mesas M are removed, while the protrusions P on the other part of the mesas M are left. For example, in the embodiment shown in FIG. 3 that the base 10b which main surface 10u is substantially flat without the mesas M, the protrusions P on one part of the peripheral area 10d is removed, and the protrusions P on the other part of the peripheral area 10d are left, or both the mesas M and the protrusions P on the other part of the peripheral area 10d are left. In the above-mentioned situations, it can be considered that the peripheral area 10d is substantially devoid of the protrusions P formed thereon in the individual light-emitting device.

In one embodiment, the height of the mesas M on the peripheral area 10d is greater than the height of the mesas M under the semiconductor stack 12. In one embodiment, the mesas M on the peripheral area 10d and the mesas M under the semiconductor stack 12 have the same shape. For example, in a top view, the top and bottom of the mesas M under the semiconductor stack 12 are circular, and both the top and bottom of the mesas M on the peripheral area 10d are circular. In another embodiment, the mesas M on the peripheral area 10d and the mesas M under the semiconductor stack 12 have different shapes. For example, in a top view, the top and bottom of the mesas M under the semiconductor stack 12 are circular, while the top of the mesas M on the peripheral area 10d are circular and the bottom of the mesas M on the peripheral area 10d are polygonal, or both the top and bottom of the mesas M on the peripheral area 10d are polygonal.

Figure 9E:
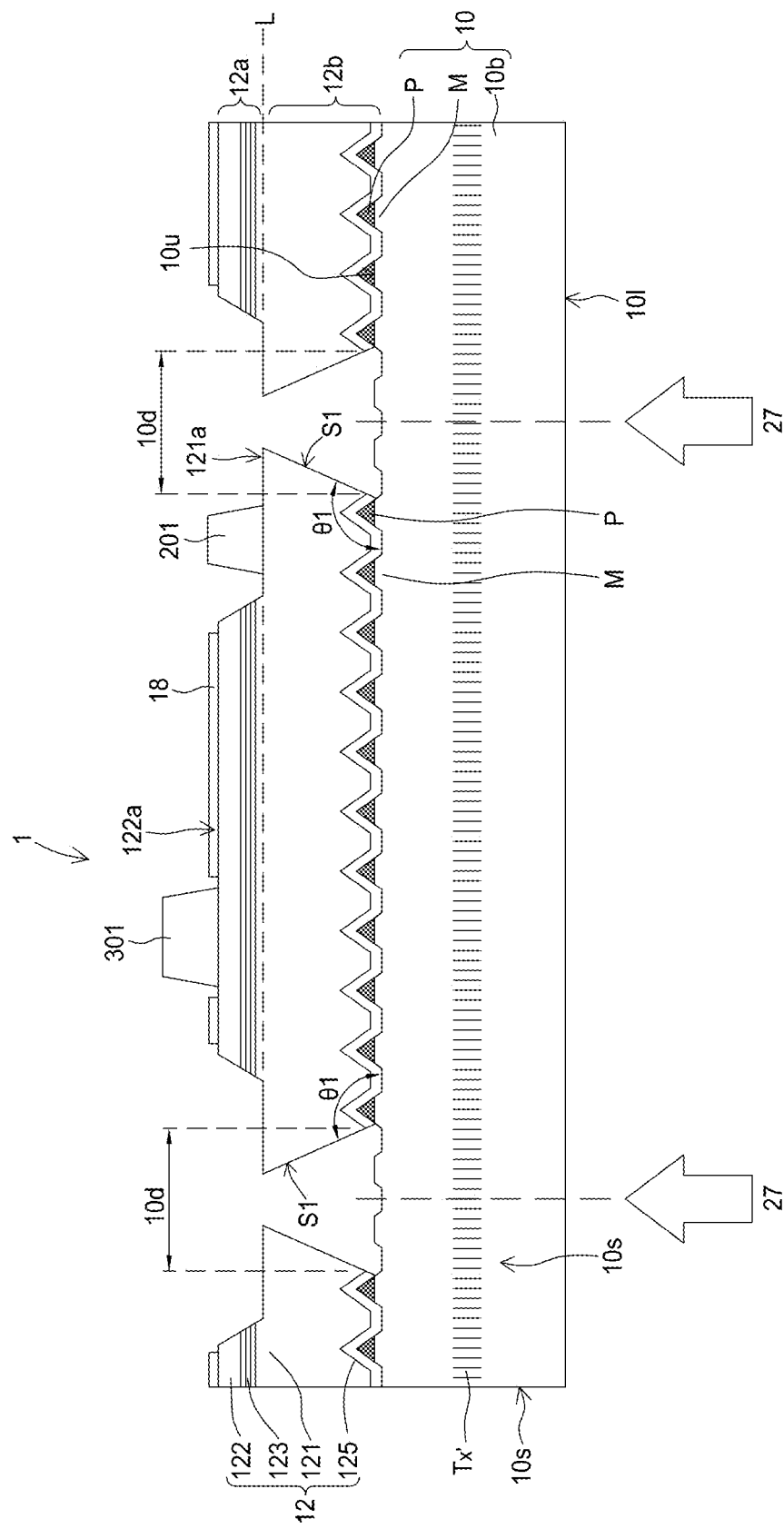

Finally, as shown in FIG. 9E, the transparent conductive layer 18, the first electrode (represented by the first pad electrode 201) and the second electrode (represented by the second pad electrode 301) are formed. Then, the wafer is divided into a plurality of light-emitting devices 1 along the peripheral area 10d, that is, along the periphery of the light-emitting devices 1. In an embodiment, the lower surface 101 of the base 10b is irradiated with a laser 27. The laser 27 is focused on the interior of the base 10b thereby forming modification regions inside the base 10b. Cracks are formed along the crystal plane of the base 10b from the modification regions. Then the plurality of light-emitting devices 1 is separated with each other along the cracks. The modification regions form the rough regions Tx' on the side wall 10s of the bases 10b of each individual light-emitting device 1.

FIG. 10A shows a side view of a light-emitting package 7 in accordance with an embodiment of the present application. FIG. 10B is a cross-sectional view taken along the A-A' line in FIG. 10A.

The light-emitting package 7 includes a housing 16 having an opening 160, and a pair of lead frames 50a and 50b is separately disposed in and covered by the housing 16, corresponding to the opening 160 and connected to the housing 16. The light-emitting device 1 is mounted in the opening 160 and electrically connected to the lead frames 50a and 50b by wires 14. In one embodiment, a filling material such as resin is filled in the opening 160 and covers the light-emitting device 1. The filling material 23 includes scattering materials (not shown) and/or wavelength converting material such as phosphor. In addition, the lead frames 50a and 50b extend out of the housing 16 to be electrically connected to an external power or an external electronic component. The extending lead frames 50a and 50b may have various shapes and be bent into various shapes. In one embodiment, as shown in FIGS. 10A and 10B, the lead frames 50a and 50b extend out of the housing 16 and are bent along side surfaces of the housing 16, and are mounted on a carrier 22. The light-emitting package 7 is applied to an edge-lit backlight source.

The opening 160 of the light-emitting package 7 has an elongated shape and the light-emitting device with a rectangular shape is installed therein. In one embodiment, the light-emitting device 1 has an aspect ratio (that is, E2 to E1) is about 5 to 1. The long-axis direction (X-axis direction) of the opening 160 is consistent with the long-axis direction of the light-emitting device 1. The side wall 160a of the opening 160 can be an inclined surface to reflect the light emitted by the light-emitting device 1 and thereby increasing the light extraction of the light-emitting package 7. The elongated shape light-emitting package 7 incorporated with the rectangular shaped light-emitting device 1 is suitable for an edge-lit backlight module. In the light-emitting package 7, the distance D2 between the light-emitting device 1 and the side wall 160a in the Y-axis direction is smaller than the distance D1 between the light-emitting device 1 and the side wall 160a in the X-axis direction. As the tendency of slim edge-lit backlight module rises, the width of the light-emitting package in the Y-axis direction is designed to be smaller. Similarly, the distance D2 between the light-emitting device 1 and the side wall 160a in the Y-axis direction is designed to be smaller. If the distance D2 between the light-emitting device 1 and the side wall 160a in the Y-axis direction is smaller, the lateral light emitted by the light-emitting device 1 is more likely absorbed by the side wall 160a, so that the brightness of the light-emitting package 7 decreases. In the experimental comparison as described above, the light-emitting device 1 in accordance with the embodiment of the present application has a higher light intensity in the forward direction, that is, the light extraction in the forward direction is higher than in the lateral direction. In the embodiment that the light-emitting package 7 incorporated with the light-emitting device 1, because the light extraction in the lateral direction of the light-emitting device 1 is relatively low, the possibility of the lateral light of the light-emitting device 1 being absorbed by the side wall 160a can be reduced, thereby improving the brightness of the light-emitting package 7. In another experimental comparison, compared with the light-emitting package 7 incorporated with the light-emitting device 6 in accordance with the comparative example, the light-emitting package 7 incorporated with the light-emitting device 1 in accordance with the embodiment of the present application has 2.5%-3% improvement in brightness.

The aspect ratio of the light-emitting device 1 or the light-emitting devices in the aforementioned embodiments can be adjusted in accordance with the design of the light-emitting package. The light-emitting devices described in the aforementioned embodiments are applicable to the light-emitting package which has a smaller width in the Y-axial direction than in the X-axis direction. In one embodiment, the light-emitting device which has the aspect ratio of greater than or equal to 2 to 1 is suitable for the light-emitting package.

Figure 11:
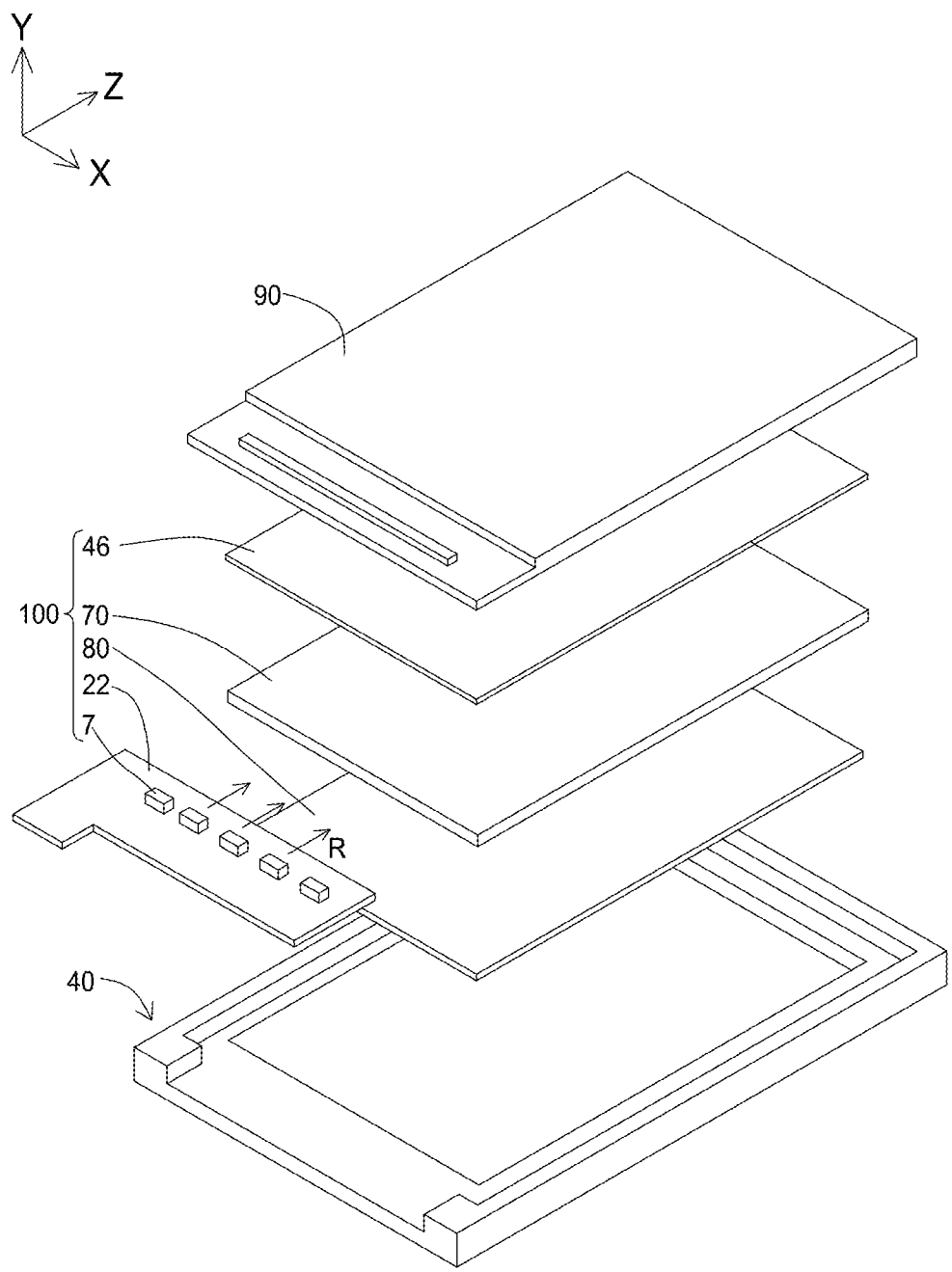
FIG. 11 shows a display device in accordance with an embodiment of the present application.

FIG. 11 shows a schematic diagram of a display device. The display device includes a frame 40, an edge-lit backlight module 100, and a liquid crystal panel 90. The edge-lit backlight module 100 includes a reflector 80, a light guide plate 70, a carrier 22, the light-emitting package 7, and an optical film 46. A plurality of light-emitting package 7 and a circuit (not shown) are disposed on the carrier 22, and the circuit is used to control the light-emitting package 7. The light-emitting package 7 disposed on the carrier 22 is located at the lateral side of the light guide plate 70. The light-emitting package 7 emits light R and the light R enters the light guide plate 70 from the lateral side of the light guide plate 70. The light guide plate 70 changes or guides the direction of light R toward the optical film 46 (e.g., light diffuser film) and the liquid crystal panel 90, and provides a backlight source for the liquid crystal panel 90 above it. As shown in FIG. 11, the light-emitting package 7 and the light-emitting device which emit the light R with a higher intensity in the Z-axis direction make the edge-lit backlight module 100 use the light source more effectively.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a substrate comprising:
      a base comprising a main surface; and
      a plurality of protrusions separately disposed on the main surface, wherein the plurality of protrusions and the base comprise different materials; and
   a semiconductor stack on the main surface, the semiconductor stack comprising a side wall, wherein an included angle between the side wall and the main surface is an obtuse angle;
   wherein the main surface comprises a peripheral area surrounding the semiconductor stack, and the peripheral area is devoid of the plurality of protrusions formed thereon; and
   wherein the base comprises a plurality of mesas on the main surface, and each one of the plurality of protrusions is disposed on a respective one of the plurality of mesas.

2. The light-emitting device according to claim 1, wherein the plurality of protrusions comprises a first material and the base comprises a second material; and a refractive index of the first material is smaller than that of the second material.

3. The light-emitting device according to claim 1, further comprising a plurality of holes between the side wall and the main surface, and the holes are devoid of the plurality of protrusions formed therein.

4. The light-emitting device according to claim 1, wherein the base comprises a side wall and the side wall of the base comprises a rough region connecting the main surface.

5. The light-emitting device according to claim 1, wherein in a top view, the substrate comprises a long edge and a short edge, and a ratio of a length of the long edge to a length of the short edge is greater than 2.

6. The light-emitting device according to claim 1, further comprising a first electrode and a second electrode on the semiconductor stack, wherein the substrate comprises a pair of short edges opposite to each other, and the first electrode and the second electrode are adjacent to the pair of short edges, respectively.

7. The light-emitting device according to claim 1, wherein the main surface is a plane and the plurality of protrusions are on the plane.

8. The light-emitting device according to claim 1, wherein the semiconductor stack comprises a buffer layer, a first semiconductor layer, an active layer, and a second semiconductor layer sequentially on the main surface, wherein the buffer layer is conformally formed on the plurality of protrusions and the main surface.

9. The light-emitting device according to claim 1, wherein the side wall of the semiconductor stack comprises a plurality of sub-side walls.

10. The light-emitting device according to claim 9, wherein an included angle between the plurality of sub-side walls is 100-175 degrees.

11. The light-emitting device according to claim 1, wherein a height of one of the plurality of mesas on the peripheral area is larger than a height of one of the plurality of mesas under the semiconductor stack.

12. The light-emitting device according to claim 1, wherein in a top view, one of the plurality of mesas on the peripheral area and one of the plurality of mesas under the semiconductor stack have different shapes.

13. The light-emitting device according to claim 12, wherein each of the plurality of mesas comprises a bottom; and
   wherein in a top view, the bottom of one of the plurality of mesas on the peripheral area is polygonal and the bottom of one of the plurality of mesas under the semiconductor stack is circular.

14. The light-emitting device according to claim 1, wherein parts of the plurality of mesas are disposed on the peripheral area.

15. The light-emitting device according to claim 1, wherein the plurality of mesas comprises the same material as that of the base.

16. The light-emitting device according to claim 1, a divergence angle of the light-emitting device is less than or equal to 130 degrees.

17. The light-emitting device according to claim 1, wherein each one of the plurality of mesas comprises a flat top surface.

* * * * *